US010151956B2

(12) United States Patent
Shin et al.

(10) Patent No.: US 10,151,956 B2
(45) Date of Patent: *Dec. 11, 2018

(54) TRANSPARENT CONDUCTIVE FILM AND LIQUID CRYSTAL DISPLAY (LCD) COMPRISING THE SAME

(71) Applicant: Samsung Display Co., Ltd., Yongin-si (KR)

(72) Inventors: Hyuneok Shin, Yongin-si (KR); Dongmin Lee, Yongin-si (KR); Chanwoo Yang, Yongin-si (KR); Juhyun Lee, Yongin-si (KR); Changoh Jeong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/867,513

(22) Filed: Jan. 10, 2018

(65) Prior Publication Data

US 2018/0157087 A1 Jun. 7, 2018

Related U.S. Application Data

(63) Continuation of application No. 15/070,707, filed on Mar. 15, 2016, now Pat. No. 9,891,484.

(30) Foreign Application Priority Data

Oct. 5, 2015 (KR) .................... 10-2015-0139996

(51) Int. Cl.
*H05K 1/02* (2006.01)
*H05K 1/09* (2006.01)
(Continued)

(52) U.S. Cl.
CPC ........ *G02F 1/13439* (2013.01); *G02F 1/1368* (2013.01); *G02F 1/133377* (2013.01);
(Continued)

(58) Field of Classification Search
CPC ............. H01L 27/3248; H01L 27/3258; H01L 27/3276; H01L 51/52; H01L 51/56; H01L 2227/323; H01L 51/5246; H01L 27/32
See application file for complete search history.

(56) References Cited

U.S. PATENT DOCUMENTS 5,667,853 A 9/1997 Fukuyoshi et al.
8,045,072 B2 10/2011 Ahn
(Continued)

FOREIGN PATENT DOCUMENTS

JP 07-114841 2/1995
JP 09-236811 9/1997
JP 09-291356 11/1997

OTHER PUBLICATIONS

Non-Final Office Action dated Apr. 13, 2017, issued in U.S. Appl. No. 15/070,707.
(Continued)

*Primary Examiner* — Tracie Y Green
(74) *Attorney, Agent, or Firm* — H.C. Park & Associates, PLC

(57) ABSTRACT

A display device including a substrate and an electrode positioned over the substrate. The electrode includes a first conductive layer, a second conductive layer disposed on the first conductive layer, and a third conductive layer disposed on the second conductive layer. The second conductive layer includes Ag and an alloy element, and the alloy element has a smaller atomic radius than Ag. A thickness of the second conductive layer is in a range of 20 Å to 60 Å. The second conductive layer has a transmittance of 85% or more in the
(Continued)

range of 20 A to 60 A. The content of the alloy element of the second conductive layer is in a range of 2 wt % to 35 wt %.

8 Claims, 10 Drawing Sheets

(51) Int. Cl.
*G02F 1/1343* (2006.01)
*G02F 1/1333* (2006.01)
*G02F 1/1368* (2006.01)
*H01L 27/12* (2006.01)
*H01L 33/42* (2010.01)
*H01B 1/02* (2006.01)
*G02F 1/1337* (2006.01)
*G02F 1/1339* (2006.01)

(52) U.S. Cl.
CPC ......... *G02F 1/134309* (2013.01); *H01B 1/02* (2013.01); *H01L 27/124* (2013.01); *H01L 33/42* (2013.01); *G02F 1/13394* (2013.01); *G02F 1/133707* (2013.01); *G02F 2001/133357* (2013.01); *G02F 2201/121* (2013.01); *G02F 2202/16* (2013.01); *G02F 2202/36* (2013.01)

(56) References Cited

U.S. PATENT DOCUMENTS

| | | | |
|---|---|---|---|
| 9,891,484 B2* | 2/2018 | Shin | G02F 1/13439 |
| 2008/0018840 A1 | 1/2008 | Uehara et al. | |
| 2011/0043495 A1* | 2/2011 | Bang | H01L 27/3276 345/204 |
| 2012/0024572 A1 | 2/2012 | Naoi et al. | |
| 2012/0220069 A1 | 8/2012 | Lin et al. | |
| 2012/0249503 A1 | 10/2012 | Teraguchi et al. | |
| 2015/0022739 A1 | 1/2015 | Chen et al. | |
| 2015/0093587 A1 | 4/2015 | Imamura et al. | |

OTHER PUBLICATIONS

Final Office Action dated Aug. 11, 2017, issued in U.S. Appl. No. 15/070,707.

Notice of Allowance dated Oct. 13, 2017, issued in U.S. Appl. No. 15/070,707.

* cited by examiner

| COMPARATIVE EXAMPLE | EMBODIMENT 1 | EMBODIMENT 2 | EMBODIMENT 3 |
|---|---|---|---|
|  |  |  |  |

(X)　　　　　　　　(Y)　　　　　　　　(Z)

TRANSPARENT CONDUCTIVE FILM AND LIQUID CRYSTAL DISPLAY (LCD) COMPRISING THE SAME

CROSS-REFERENCE TO RELATED PATENT APPLICATIONS

This application is a continuation of U.S. patent application Ser. No. 15/070,707, filed on Mar. 15, 2016, and claims priority from and the benefit of Korean Patent Application No. 10-2015-0139996, filed on Oct. 5, 2015, which are hereby incorporated by reference for all purposes as if fully set forth herein.

BACKGROUND

Field

Exemplary embodiments relate to a transparent conductive film, and a liquid crystal display (LCD) including the transparent conductive film.

Discussion of the Background

A liquid crystal display (LCD) device is one of the most widely used display devices, and includes two display plates including electric field-generating electrodes such as a pixel electrode and a common electrode, and a liquid crystal (LC) layer disposed therebetween. The LCD device generates an electric field in the LC layer by applying a voltage to the electric field-generating electrodes; determines the alignment of LC molecules in the LC layer via the generation of the electric field; and displays an image by controlling the polarization of incident light.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include a transparent conductive film and a liquid crystal display (LCD) including the transparent conductive film.

Additional aspects will be set forth in the detailed description which follows, and, in part, will be apparent from the disclosure, or may be learned by practice of the inventive concept.

An exemplary embodiment discloses a transparent conductive film including a first conductive layer; a second conductive layer disposed on the first conductive layer; and a third conductive layer disposed on the second conductive layer. The second conductive layer includes silver (Ag) and an alloy element, the alloy element having a smaller atomic radius than the Ag, and a thickness of the second conductive layer is in a range of 20 Å to 60 Å.

An exemplary embodiment also discloses a liquid crystal display (LCD) including a first substrate; a liquid crystal (LC) layer on the first substrate, the liquid crystal (LC) layer comprising a plurality of LC molecules; and a pixel electrode and a common electrode applying an electric field to the LC layer. The common electrode includes a first conductive layer, a second conductive layer disposed on the first conductive layer, and a third conductive layer disposed on the second conductive layer. The second conductive layer includes Ag and an alloy element, the alloy element having a smaller atomic radius than the Ag, and a thickness of the second conductive layer is in a range of 20 Å to 60 Å.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED S

Figure 1:
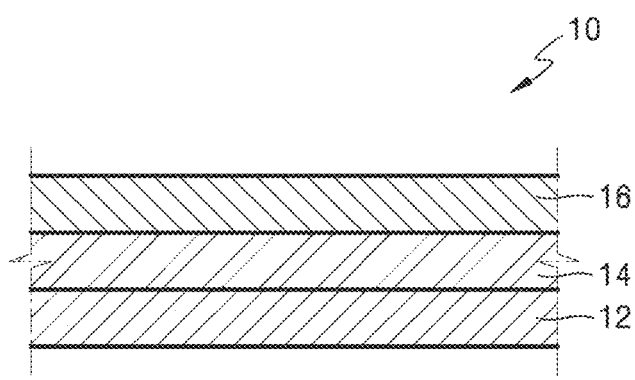
FIG. 1 is a schematic cross-sectional view of a transparent conductive film according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

One or more exemplary embodiments of the present invention will be described below in more detail with reference to the accompanying drawings. Those components that are the same or are in correspondence are rendered the same reference numeral regardless of the figure number, and redundant explanations are omitted.

Figure 2:
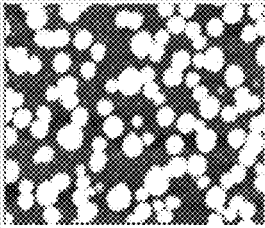
FIG. 2 Illustrates cohesion of silver (Ag) according to an alloy element content of a second conductive layer of FIG. 1.
Figure 2:
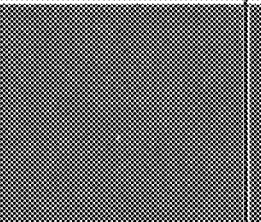
Figure 2:
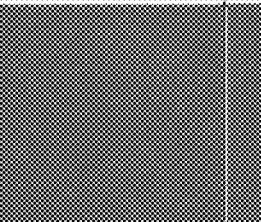
Figure 2:
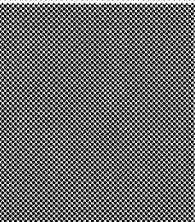
Figure 3:
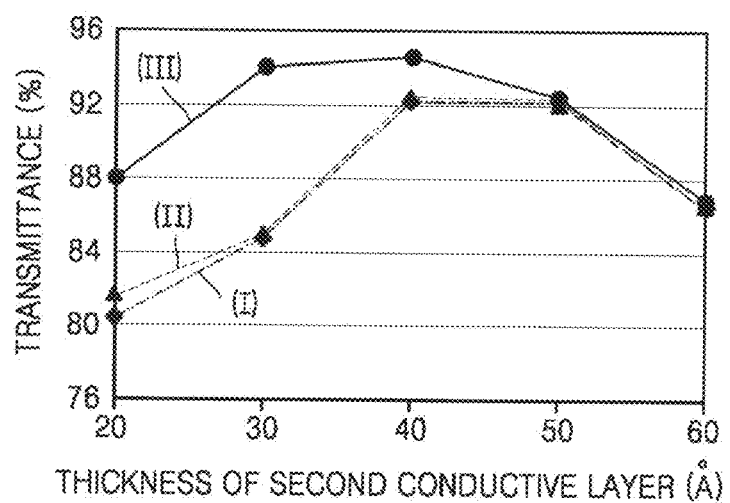
FIG. 3 is a graph showing transmittance versus thickness of the second conductive layer of FIG. 1.
Figure 4:
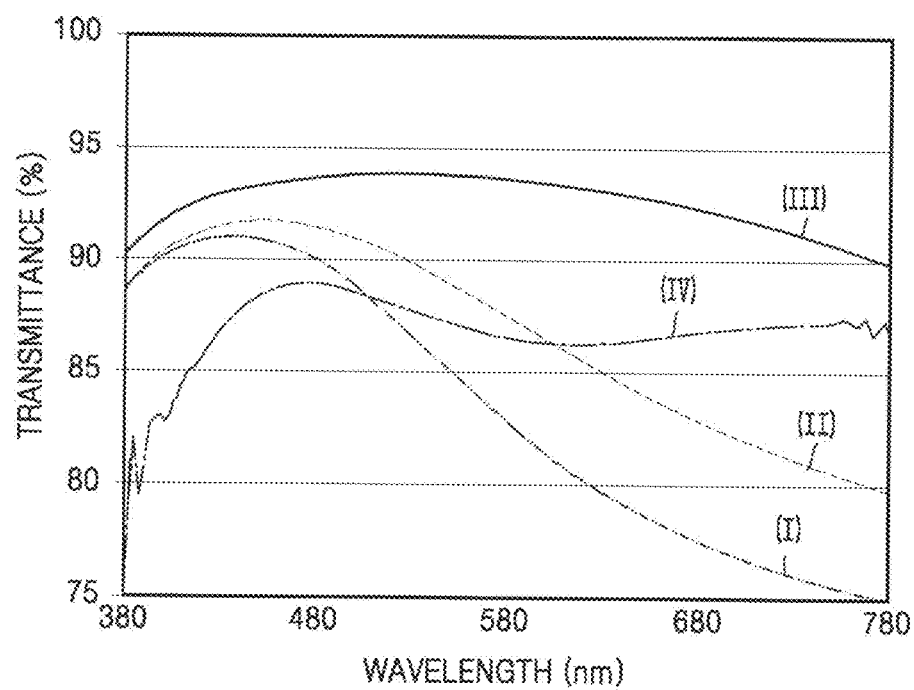
FIG. 4 is a graph showing transmittance of the second conductive layer of FIG. 1 versus a wavelength of light.
Figure 5:
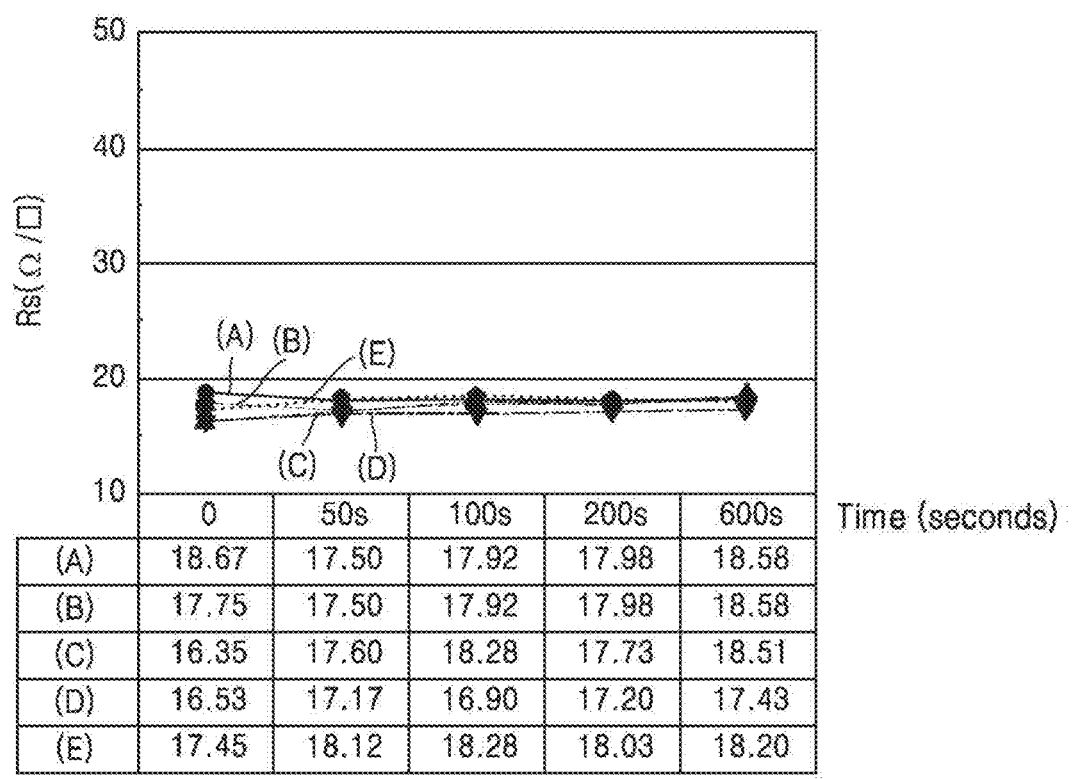
FIG. 5 is a graph showing surface resistance Rs of the transparent conductive film versus time for various thicknesses of a third conductive layer of FIG. 1.
Figure 6:
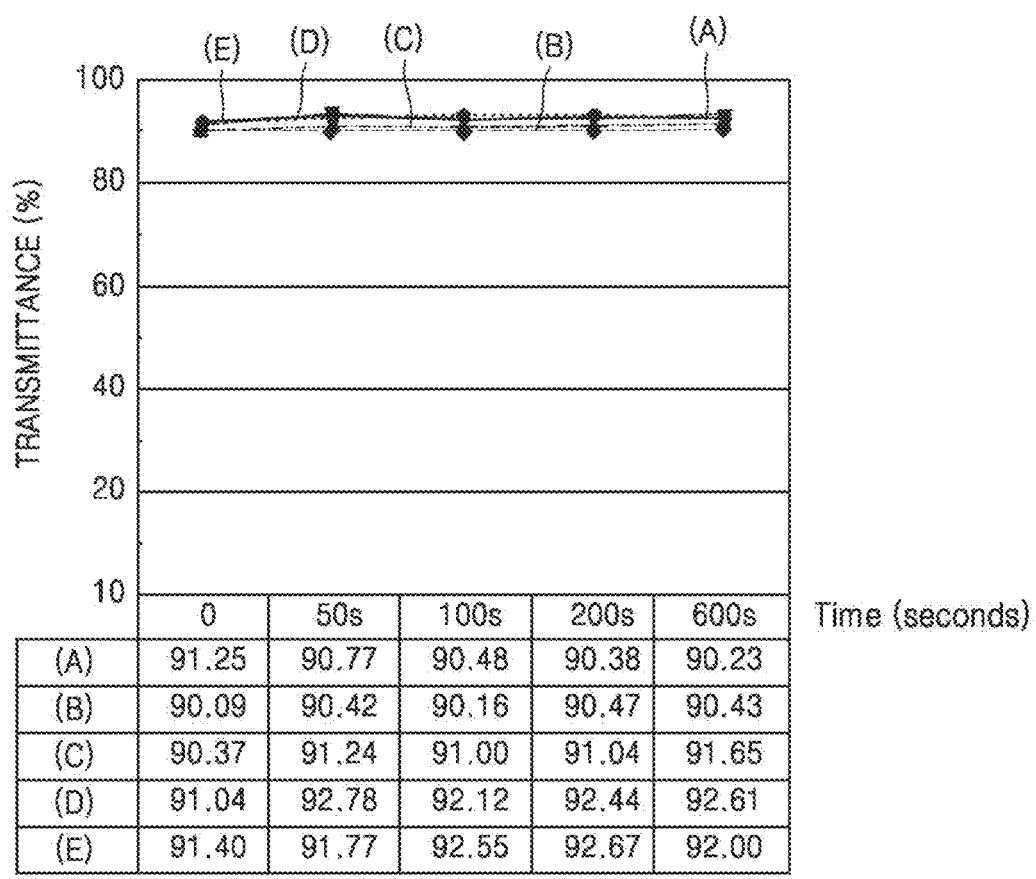
FIG. 6 is a graph showing transmittance of the transparent conductive film versus time for various thicknesses of the third conductive layer of FIG. 1.

FIG. 1 is a schematic cross-sectional view of a transparent conductive film 10 according to an exemplary embodiment of the present invention. FIG. 2 Illustrates cohesion of silver (Ag) according to an alloy element content of a second conductive layer 14 of FIG. 1. FIG. 3 is a graph showing transmittance versus thickness of the second conductive layer 14 of FIG. 1. FIG. 4 is a graph showing transmittance of the second conductive layer 14 of FIG. 1 versus a wavelength of light. FIG. 5 is a graph showing surface resistance Rs of the transparent conductive film 10 versus time for various thicknesses of a third conductive layer 16 of FIG. 1. FIG. 6 is a graph showing transmittance of the transparent conductive film 10 versus time for various thicknesses of the third conductive layer 16 of FIG. 1. FIGS. 7A-7F show results of a test of a protection capability of the third conductive layer 16 of FIG. 1.

Referring to FIGS. 1-7, the transparent conductive film 10 may include a first conductive layer 12, the second conductive layer 14 disposed on the first conductive layer 12, and the third conductive layer 16 disposed on the second conductive layer 14.

First, the second conductive layer 14 may be formed of an Ag alloy. The Ag alloy includes Ag and an alloy element, and the alloy element may be positioned at an interstitial site within a crystal structure of Ag. Because Ag has a face-centered cubic (FCC) structure, the alloy element may be positioned at an interstitial site of the FCC structure. To facilitate permeation of Ag into the crystal structure, the alloy element may be any element having an atomic radius equal to or less than that of Ag.

For example, the alloy element may include at least one of zinc (Zn), nickel (Ni), cobalt (Co), copper (Cu), gallium (Ga), germanium (Ge), platinum (Pt), antimony (Sb), manganese (Mn), tungsten (W), and molybdenum (Mo). The alloy element may further include indium (In) to improve the durability of the second conductive layer 14 with respect to sulfur (S).

The alloy element may prevent cohesion of Ag during formation of the second conductive layer 14. Accordingly, even when the second conductive layer 14 is formed to have a very small thickness, a uniform continuous layer may be formed without cohesion of Ag. The content of the alloy element in the second conductive layer 14 may be in a range of 2 wt % to 35 wt %.

FIG. 2 illustrates cohesion of Ag according to an alloy element content of the second conductive layer 14. In FIG. 2, Comparative Example 1 shows a conductive layer formed of an alloy in which In is contained in Ag by 0.5 wt %, and Embodiments 1, 2, and 3 respectively show conductive layers formed of alloys in which 2 wt %, 3 wt % and 5 wt % of Ga from among alloy elements according to the present invention are respectively contained in Ag. The conductive layers of FIG. 2 each included an ITO layer, and the total thicknesses of the conductive layers including the ITO layers were each 150 Å. After the conductive layers were formed on the ITO layers, the conductive layers were thermally treated for one hour at 250° C.

In Comparative Example 1, the size of an aggregation of Ag was 12.1 nm, and thus, cohesion was very severe. However, in Embodiments 1, 2, and 3 respectively including 2 wt %, 3 wt %, and 5 wt % of Ga, because a formed aggregation of Ag has a size of about 1 nm, cohesion of Ag was prevented. Thus, when the content of an alloy element in the second conductive layer 14 is 2 wt % or greater, cohesion of Ag is prevented, and thus, an ultra-thin second conductive layer 14 having a uniform thickness may be formed. However, when the content of an alloy element in the second conductive layer 14 is greater than 35 wt %, as the alloy element content extremely increases, the characteristics of Ag may decrease, resistance of the second conductive layer 14 may increase, and oxidation resistance thereof may decrease. Accordingly, the content of the alloy element in the second conductive layer 14 may be 2 wt % to 35 wt %.

The second conductive layer 14 may be formed by sputtering. In this case, to facilitate manufacturing of a sputtering target, the content of the alloy element in the sputtering target may be 20 wt % or less. Accordingly, the second conductive layer 14 formed using the sputtering target may also include an alloy element of 20 wt % or less.

As such, because the second conductive layer 14 includes the alloy element that prevents cohesion of Ag, the second conductive layer 14 may have a very small thickness, and accordingly the second conductive layer 14 may have high light transmittance.

FIG. 3 is a graph showing transmittance versus thickness of the second conductive layer 14, and FIG. 4 is a graph showing the transmittance of the second conductive layer 14 versus the wavelength of light. In FIGS. 3 and 4, (I) is a conductive layer formed with the same composition as in Comparative Example 1 of FIG. 2, (II) is a conductive layer formed of pure Ag, and (III) is a conductive layer formed with the same composition as in Embodiment 3 of FIG. 2. Each of the conductive layers (I), (II), and (III) of FIGS. 3 and 4 has a thickness of 30 Å. In FIG. 4, (IV) is a conductive layer formed of ITO and used as a common electrode included in an existing liquid crystal display (LCD). The conductive layer (IV) has a thickness of 1200 Å.

FIG. 3 illustrates transmittance when light having a wavelength of 550 nm was radiated to the second conductive layer 14. As shown in FIG. 3, in the conductive layers (I) and (II), transmittance rapidly decreases at a thickness of 40 Å or less. However, the conductive layer (III) provides higher transmittance than the conductive layers (I) and (II) at a thickness of 50 Å or less, and has transmittance of 85% or more in the range of 20 Å to 60 Å, and has transmittance of 90% or more in the range of 30 Å to 50 Å.

This is because, as described above, because the second conductive layer 14 includes an alloy element of 2 wt % or more, and thus, cohesion of Ag is prevented, even when the second conductive layer 14 is formed to have a very small thickness, a uniform continuous layer may be formed without cohesion. As shown in FIG. 4, because the conductive layer (III) has transmittance of 90% or more within all wavelength ranges of visible light, the second conductive layer 14 has good optical characteristics.

However, when the second conductive layer 14 has a thickness less than 20 Å, Ag may cohere. Thus, it is difficult for the second conductive layer 14 to be formed as a continuous layer, and thus, resistance of the transparent conductive film 10 may increase. When the second conductive layer 14 has a thickness greater than 60 Å, transmittance of the transparent conductive film 10 may decrease. Accordingly, the second conductive layer 14 may be formed to have a thickness of 20 Å to 60 Å. To secure higher transmittance, the second conductive layer 14 may be formed to have a thickness of 30 Å to 50 Å.

Referring back to FIG. 1, the first conductive layer 12 and the third conductive layer 16 may prevent Ag contained in the second conductive layer 14 from being exposed to the outside and damaged. The first conductive layer 12 and the third conductive layer 16 may include at least one of ITO, IZO, and AZO.

The first conductive layer 12 and the third conductive layer 16 may each have a thickness of 20 Å to 70 Å. The thickness of the first conductive layer 12 may be different from that of the third conductive layer 16.

FIGS. 5 and 6 are graphs respectively showing the surface resistance Rs (Ω/□) and transmittance of the transparent conductive film 10 versus time for variations in the thickness of the third conductive layer 16. FIG. 7 shows a result of a test on the protection ability of the third conductive layer 16. The protection ability was tested via a determination as to whether the second conductive layer 14 was damaged when the transparent conductive film 10 was dipped in an EP-6 solution for 600 seconds.

Figure 7A:
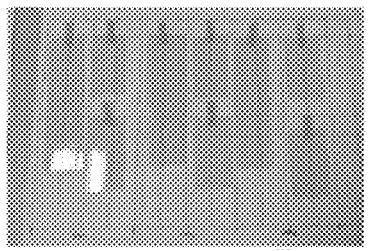
FIG. 7(A), FIG. 7(B), FIG. 7(C), FIG. 7(D), FIG. 7(E), and FIG. 7(F) show a result of a test on a protection ability of the third conductive layer of FIG. 1.
Figure 7B:
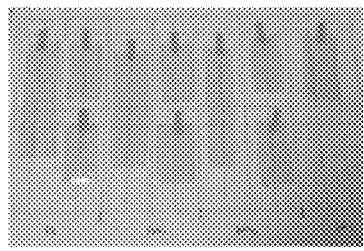
Figure 7C:
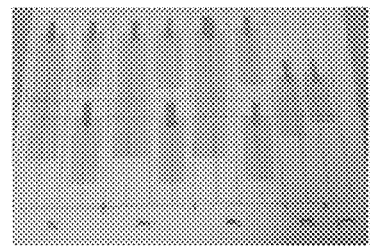
Figure 7D:
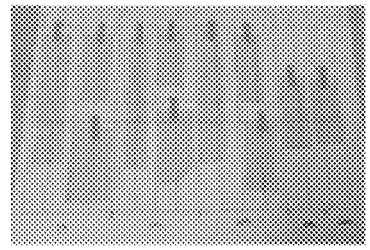
Figure 7E:
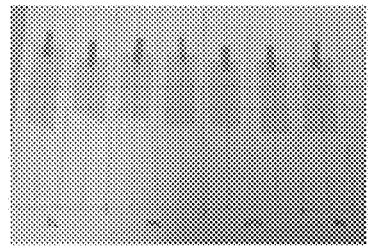
Figure 7F:
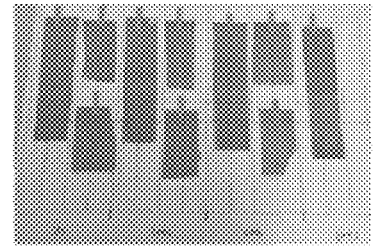

In FIGS. 5-7F, the first conductive layer 12 was formed of ITO to have a thickness of 70 Å, the second conductive layer 14 was formed at the same composition as Embodiment 3 of FIG. 2 to have a thickness of 40 Å, and the third conductive layer 16 was formed of ITO, and the thickness of the third conductive layer 16 was changed to 20 Å (A), 30 Å (B), 40 Å (C), 70 Å (D), and 100 Å (E). FIG. 7(F) is a result of a test on a conductive film formed of only the second conductive layer 14.

First, as illustrated in FIGS. 7A-7F, when the third conductive layer 16 has a thickness of 20 Å or more, damage to the second conductive layer 14 by external environments may be prevented. Consequently, as seen on FIGS. 5 and 6, surface resistance Rs and transmittance of the transparent conductive film 10 rarely change. FIG. 6 illustrates transmittance when light having a wavelength of 550 nm was radiated toward the transparent conductive film 10.

When the time taken to use a target to form the first conductive layer 12 and the third conductive layer 16 increases, a nodule is generated on the surface of the target. Accordingly, particles may drop on the surfaces of the first conductive layer 12 and the third conductive layer 16, and thus, the qualities of the first conductive layer 12 and the third conductive layer 16 may be degraded. To address this problem, the first conductive layer 12 and the third conductive layer 16 may each be formed to have a thickness of 70 Å or less. When the thicknesses of the first conductive layer 12 and the third conductive layer 16 are greater than 70 Å, an overall transmittance of the transparent conductive film 10 may decrease. Accordingly, the first conductive layer 12 and the third conductive layer 16 may each have a thickness of 20 Å to 70 Å.

Because the transparent conductive film 10 includes the second conductive layer 14 capable of being implemented as an ultra-thin type, and the first conductive layer 12 and the third conductive layer 16 each having a thickness of 70 Å, or less as described above, the transparent conductive film 10 may have a very small thickness. Thus, the transparent conductive film 10 may have not only good optical characteristics but also good electrical properties and good laser patterning characteristics.

Figure 8:
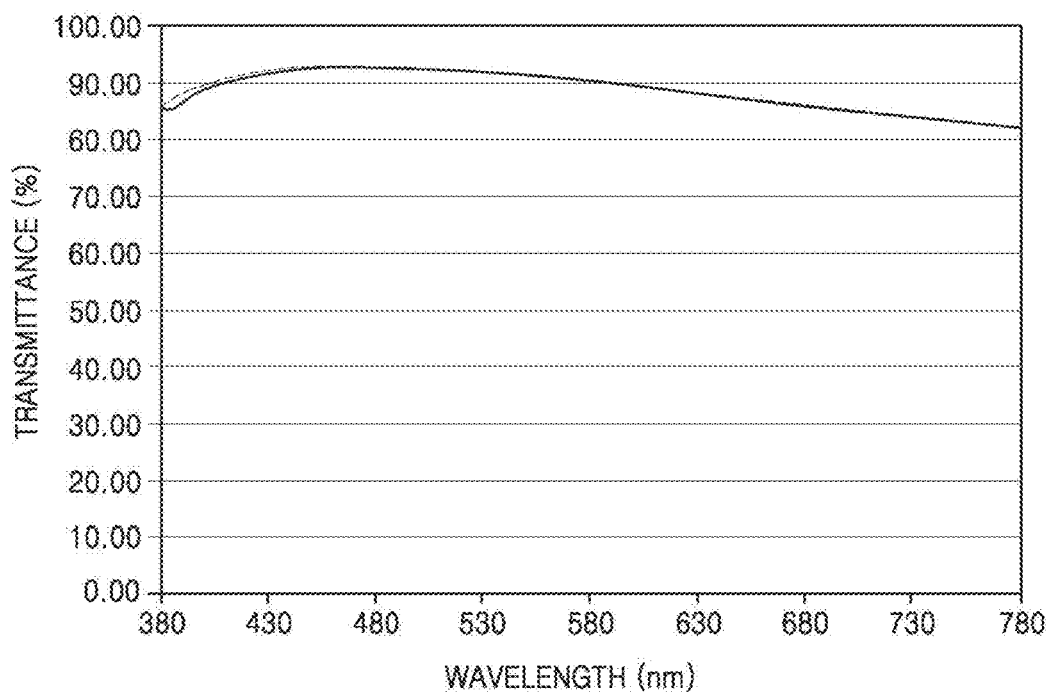
FIG. 8 is a graph showing transmittance of the transparent conductive film of FIG. 1 versus a wavelength of light.
Figure 9:
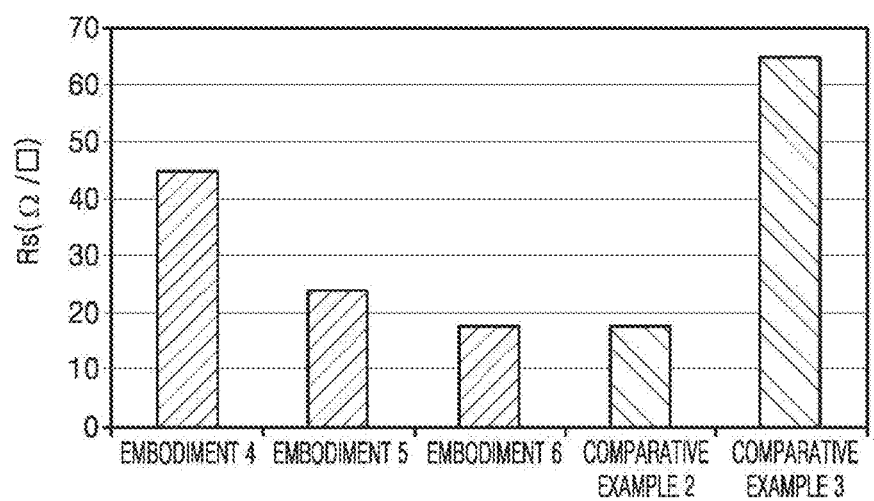
FIG. 9 is a bar graph showing surface resistance Rs of the transparent conductive film of FIG. 1 comparing various thicknesses of the second conductive layer of FIG. 1.
Figure 10:
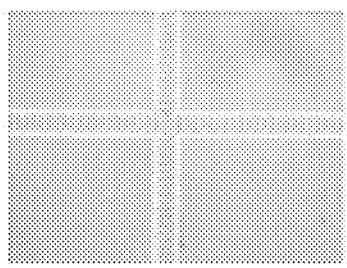
FIG. 10 schematically illustrates laser patterning characteristics of the transparent conductive film of FIG. 1.
Figure 10:
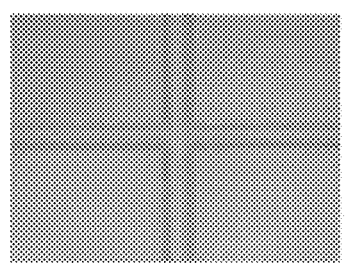
Figure 10:
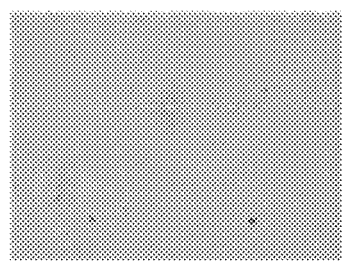

FIG. 8 is a graph showing transmittance of the transparent conductive film 10 of FIG. 1 versus a wavelength of light. FIG. 9 is a bar graph showing surface resistance Rs (Ω/□) of the transparent conductive film 10 of FIG. 1 for variations in the thickness of the second conductive layer 14 of FIG. 1. FIG. 10 schematically illustrates laser patterning characteristics of the transparent conductive film 10 of FIG. 1. FIGS. 8, 9, and 10 will now be described in cooperation with FIG. 1.

In FIG. 8, the transparent conductive film 10, of which transmittance was tested, includes the first conductive layer 12 and the third conductive layer 16 each formed of ITO to have a thickness of 70 Å, and the second conductive layer 14 formed at the same composition as Embodiment 3 of FIG. 2 to have a thickness of 40 Å. As illustrated in FIG. 8, because the transparent conductive film 10 has transmittance of 80% or more over the entire wavelength band of visible light, the transparent conductive film 10 according to an exemplary embodiment of the present invention has high optical characteristics.

FIG. 9 illustrates a result of a measurement of the surface resistance Rs (Ω/□) of the transparent conductive film 10. In FIG. 9, Comparative Examples 2 and 3 are respectively conductive layers formed of ITO to respectively have thicknesses of 1350 Å and 500 Å, and Embodiments 4 to 6 are cases where only the thickness of the second conductive layer 14 of the tested transparent conductive film 10 of FIG. 8 sequentially increased to 30 Å, 40 Å, and 50 Å. As illustrated in FIG. 9, the transparent conductive film 10 according to an exemplary embodiment of the present invention has a much smaller surface resistance Rs than Comparative Example 3, and the transparent conductive films 10 according to Embodiments 5 and 6 each have surface resistance Rs that does not differ greatly from that of Comparative Example 2. In other words, even when the transparent conductive film 10 is formed to have a very small thickness, the transparent conductive film 10 has good electrical properties.

FIG. 10 shows results of laser trimming, wherein (X) is a result of laser-patterning the transparent conductive film 10 according to Embodiment 5 of FIG. 9, and (Y) and (Z) are respectively results of laser-patterning the conductive layers according to Comparative Examples 2 and 3 of FIG. 9. As illustrated in FIG. 10, a more delicate pattern is formed in the case of (X) than in the cases of (Y) and (Z), because Ag has a larger absorption coefficient than ITO. For example, when laser light radiated for patterning has a wavelength of 1024 nm, ITO has an absorption coefficient of 0.02, but Ag has an absorption coefficient of 8. Thus, the transparent conductive film 10 may have good laser trimming characteristics. Accordingly, when the transparent conductive film 10 is used as a common electrode or the like of an LCD, the common electrode may be easily patterned.

Figure 11:
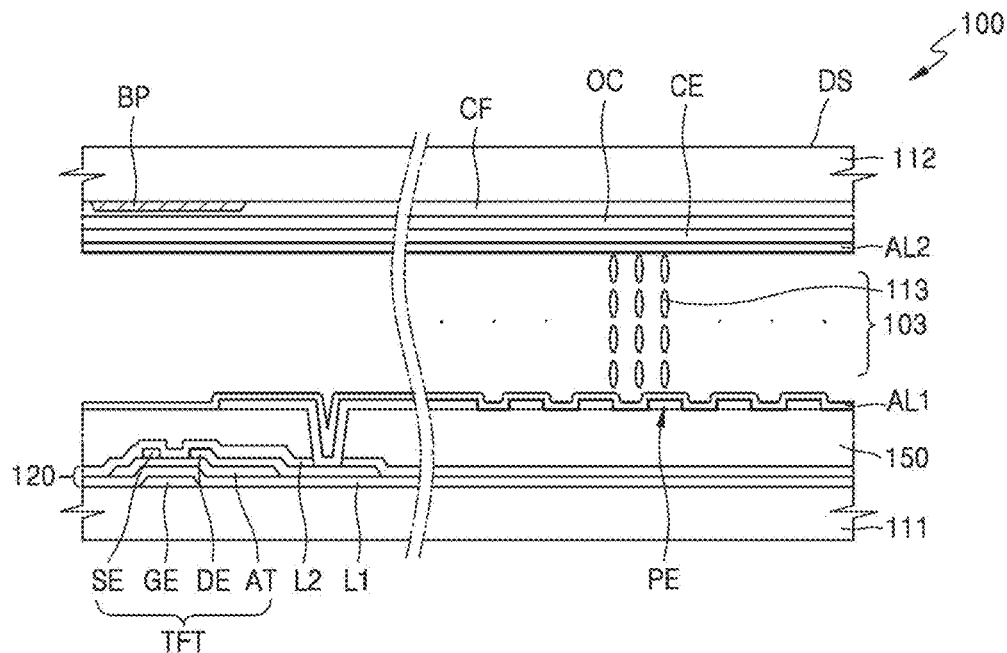
FIG. 11 is a schematic cross-sectional view of an LCD according to another exemplary embodiment of the present invention.
Figure 12:
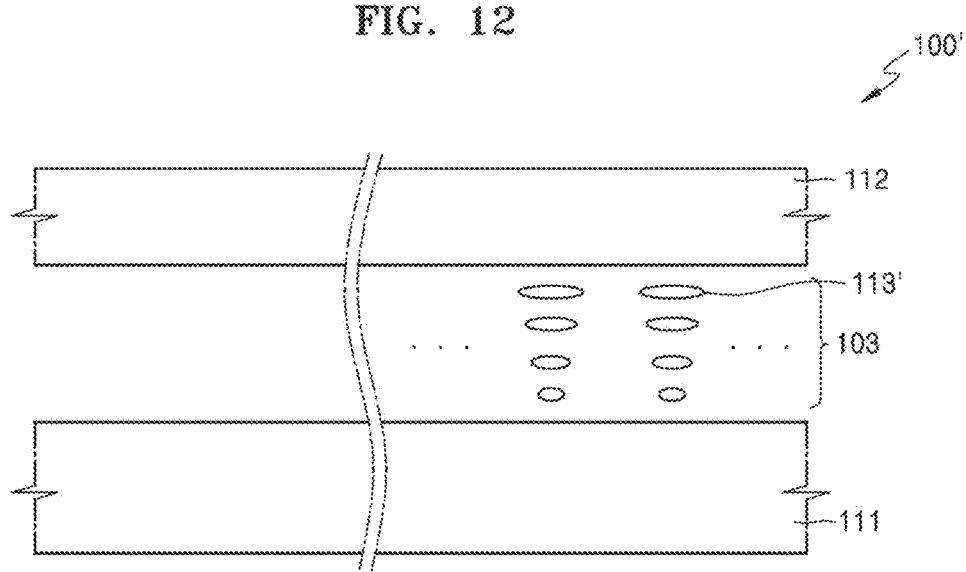
FIG. 12 is a schematic cross-sectional view of an LCD according to another exemplary embodiment of the present invention.

FIGS. 11 and 12 are schematic cross-sectional views of LCDs 100 and 100' according to exemplary embodiments of the present invention.

Referring to FIG. 11, the LCD 100 may include a first substrate 111, a liquid crystal (LC) layer 103 disposed on the first substrate 111 and formed of a plurality of LC molecules 113, and a pixel electrode PE and a common electrode CE applying an electric field to the LC layer 103. The LCD 100 may also include a second substrate 112 facing the first substrate 111.

A thin film transistor (TFT) array layer 120, the pixel electrode PE, and a first alignment layer AL1 may be formed on the first substrate 111.

The first substrate 111 may be not only a glass substrate but also a plastic substrate including polyethylene terephthalate (PET), polyethylene naphthalate (PEN), polyimide, or the like.

The TFT array layer 120 includes a plurality of switching devices TFT, and also includes a plurality of gate lines (not shown) and a plurality of data lines (not shown). Each switching device TFT is a thin film transistor, and includes an active layer AT, a gate electrode GE, a source electrode SE, and a drain electrode DE.

A first insulating layer L1, which is a gate insulating layer, is formed on the gate electrode GE, and the active layer AT is formed on the first the insulating layer L1. The source electrode SE and the drain electrode DE are spaced apart from each other on the active layer AT, and a second insulating layer L2 is formed to cover the source electrode SE and the drain electrode DE. Although FIG. 11 illustrates a bottom gate type TFT in which the gate electrode GE is located under the active layer AT, exemplary embodiments of the present invention are not limited thereto. A top gate type TFT in which the gate electrode GE is located above the active layer AT may be employed.

The active layer AT may be formed to include various materials. For example, the active layer AT may include an inorganic semiconductor material, such as amorphous silicon or crystalline silicon. As another example, the active layer AT may include an oxide semiconductor. As another example, the active layer AT may include an organic semiconductor material.

The gate electrode GE, the source electrode SE, and the drain electrode DE may each be formed of at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu) in a single or multi-layered structure.

The first insulating layer L1 and the second insulating layer L2 may each be formed of any of various insulative materials. The first insulating layer L1 and the second insulating layer L2 may each be formed of at least one of $SiO_2$, $SiN_x$, SiON, $Al_2O_3$, TiO2, $Ta_2O_5$, $HfO_2$, $ZrO_2$, BST, and PZT in a single- or multi-layered structure.

A planarization layer 150 may be further formed on the TFT array layer 120, and the pixel electrode PE is located on the planarization layer 150. The pixel electrode PE penetrates through the planarization layer 150 and the second insulating layer L2 and contacts the drain electrode DE of the switching device TFT. The first alignment layer AL1 for aligning the LC molecules 113 may be formed on the pixel electrode PE.

A barrier pattern BP, a color filter CF, an over coating layer OC, and the common electrode CE may be formed on the second substrate 112, and a second alignment layer AL2 for aligning the LC molecules 113 may be formed on the common electrode CE.

The second substrate 112 may be a glass substrate or a transparent plastic substrate, and an outer surface of the second substrate 112 is a display surface DS.

The barrier pattern BP is disposed on a portion of the second substrate 112 facing a portion of the first substrate 111 on which a switching device TFT, a gate line (not shown), and a data line (not shown) are formed, and shields light. The disposition location of the barrier pattern BP is exemplary, and the barrier pattern BP may be disposed on the first substrate 111.

The color filter CF is disposed on the second substrate 112 and filters color light. The disposition location of the color filter CF is exemplary, and the color filter CF may be disposed on the first substrate 111.

The over coating layer OC is disposed on the color filter CF formed on the second substrate 112, and planarizes an upper surface of the second substrate 112. The over coating layer OC may be omitted.

The common electrode CE is disposed on the second substrate 112 to face the pixel electrode PE, and a reference voltage that defines the polarity of a voltage applied to the pixel electrode PE, namely, a common voltage, is applied to the common electrode CE. For example, the common electrode CE may have a flat plate shape.

The common electrode CE may be formed of the transparent conductive film 10 of FIG. 1. In other words, the common electrode CE may include a second conductive layer formed of an Ag alloy and disposed between a first conductive layer formed of, for example, ITO and a third conductive layer.

The second conductive layer may include Ag and an alloy element that prevents the Ag from cohering during formation of the second conductive layer. The alloy element may include at least one of zinc (Zn), nickel (Ni), cobalt (Co), copper (Cu), gallium (Ga), germanium (Ge), platinum (Pt), antimony (Sb), manganese (Mn), tungsten (W), and molybdenum (Mo), and may further include indium (In) to improve durability against sulfur (S). The alloy element may be included in the second conductive layer by 2 wt % to 35 wt %, and the second conductive layer may be formed to have a thickness in a range of 20 Å to 60 Å.

The first conductive layer and the third conductive layer may prevent the second conductive layer from being exposed to the outside and damaged. The first conductive layer may improve the bonding capability between the common electrode CE and the planarization layer 150. The first conductive layer and the third conductive layer may each be formed to have a thickness in a range of 20 Å to 70 Å.

Thus, the common electrode CE may be formed to be very thin, and accordingly, may have good optical characteristics and good electrical properties. Moreover, the performance of the LCD 100 including the common electrode CE may improve.

The LC layer 103 is formed of the LC molecules 113. The LC layer 103 may be, for example, a vertical arrangement mode LC layer. In other words, when no electric fields are formed, a longer axis of the LC molecules 113 may be perpendicular to a surface of the first substrate 111. When a voltage is applied between the pixel electrode PE and the common electrode CE, an electric field is applied to the LC layer and changes an arrangement of the LC molecules 113, and thus, the amount of light transmitted by the LC layer 103 is adjusted and accordingly the LCD 100 displays an image.

The LCD 100' of FIG. 12 is the same as the LCD 100 of FIG. 11 in that the LC layer 103 is disposed between the first substrate 111 and the second substrate 112 and an electric field is vertically formed, but is different from the LCD 100 of FIG. 11 in that LC molecules 113' are horizontally arranged. In detail, the LC molecules 113' of FIG. 12 are horizontally arranged, and may be twisted 90° between the pixel electrode PE of FIG. 11 and the common electrode CE of FIG. 11.

Figure 13:
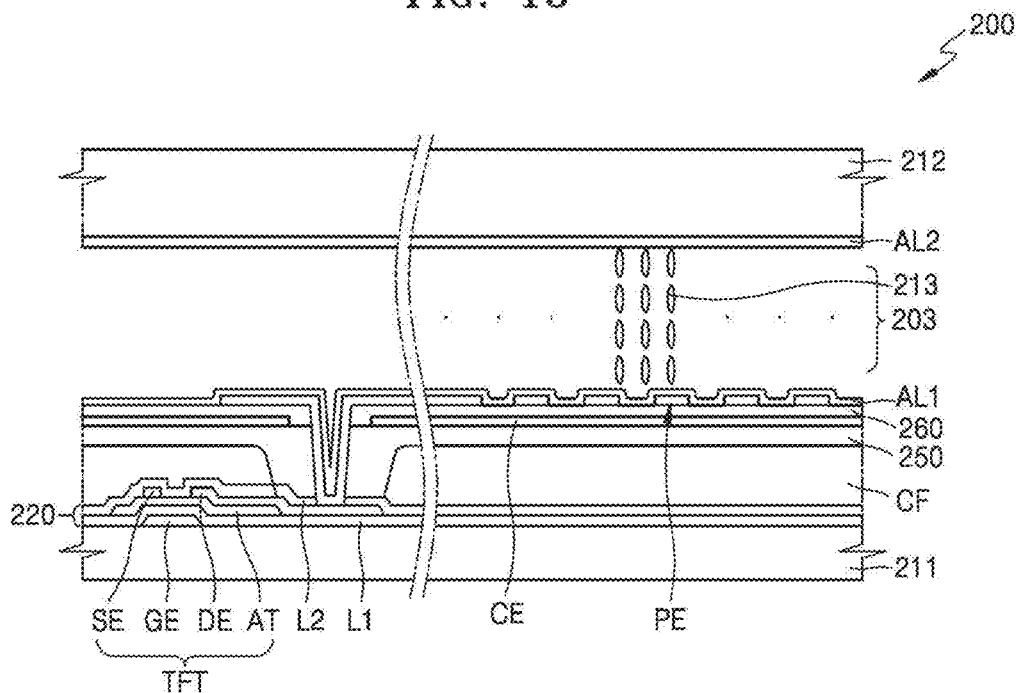
FIG. 13 is a schematic cross-sectional view of an LCD according to another exemplary embodiment of the present invention.

FIG. 13 is a schematic cross-sectional view of an LCD 200 according to another exemplary embodiment of the present invention.

Referring to FIG. 13, the LCD 200 may include a first substrate 211, an LC layer 203 disposed on the first substrate 211 and formed of a plurality of LC molecules 213, and a pixel electrode PE and a common electrode CE applying an electric field to the LC layer 203. The LCD 200 may also include a second substrate 212 facing the first substrate 211. A first alignment layer AL1 and a second alignment layer AL2 for arranging the LC molecules 213 may be formed on the first substrate 211 and the second substrate 212, respectively.

A TFT array layer 220, a color filter CF, the common electrode CE, and the pixel electrode PE may be positioned on the first substrate 211. A barrier pattern may be formed on an area of the first substrate 211 where a switching device TFT is formed between color filters CF. The barrier pattern may be integrally formed with a spacer that maintains an interval between the first substrate 211 and the second substrate 212.

Each switching device TFT of the TFT array layer 220 may be a thin film transistor, and may includes an active layer AT, a gate electrode GE, a source electrode SE, and a drain electrode DE. A first insulating layer L1, which is a gate insulating layer, is formed on the gate electrode GE, and the active layer AT is formed on the first the insulating layer L1. The source electrode SE and the drain electrode DE are spaced apart from each other on the active layer AT, and a second insulating layer L2 is formed to cover the source electrode SE and the drain electrode DE.

The color filter CF may be disposed on the TFT array layer 220. However, exemplary embodiments of the present invention are not limited thereto, and the color filter CF may be disposed on the second substrate 212.

A planarization layer 250 may be formed on the color filter CF, and the common electrode CE may be positioned on the planarization layer 250.

The common electrode CE may be formed of the transparent conductive film 10 of FIG. 1. In other words, the common electrode CE may include a second conductive layer formed of an Ag alloy and disposed between a first conductive layer formed of, for example, ITO and a third conductive layer.

The first conductive layer and the third conductive layer may prevent the second conductive layer from being exposed to the outside and damaged. The first conductive layer may improve the bonding capability between the common electrode CE and the planarization layer 250. The first conductive layer and the third conductive layer may each be formed to have a thickness in a range of 20 Å to 70 Å.

The second conductive layer may include Ag and an alloy element that prevents the Ag from cohering during formation of the second conductive layer, and may be formed to have a thickness in a range of 20 Å to 70 Å. The content of the alloy element in the second conductive layer may be 2 wt % to 35 wt %. The alloy element may include at least one of zinc (Zn), nickel (Ni), cobalt (Co), copper (Cu), gallium (Ga), germanium (Ge), platinum (Pt), antimony (Sb), manganese (Mn), tungsten (W), and molybdenum (Mo), and may further include indium (In) to improve durability against sulfur (S).

Thus, the common electrode CE may be formed to be very thin, and accordingly, may have good optical characteristics and good electrical properties.

A third insulation layer 260 may be disposed on the common electrode CE, and the pixel electrode PE may be disposed on the third insulation layer 260. Thus, when a voltage is applied to the common electrode CE and the pixel electrode PE, a horizontal electric field may be generated parallel to the first substrate 211, and may change the arrangement of the LC molecules 213 of the LC layer 203.

Figure 14:
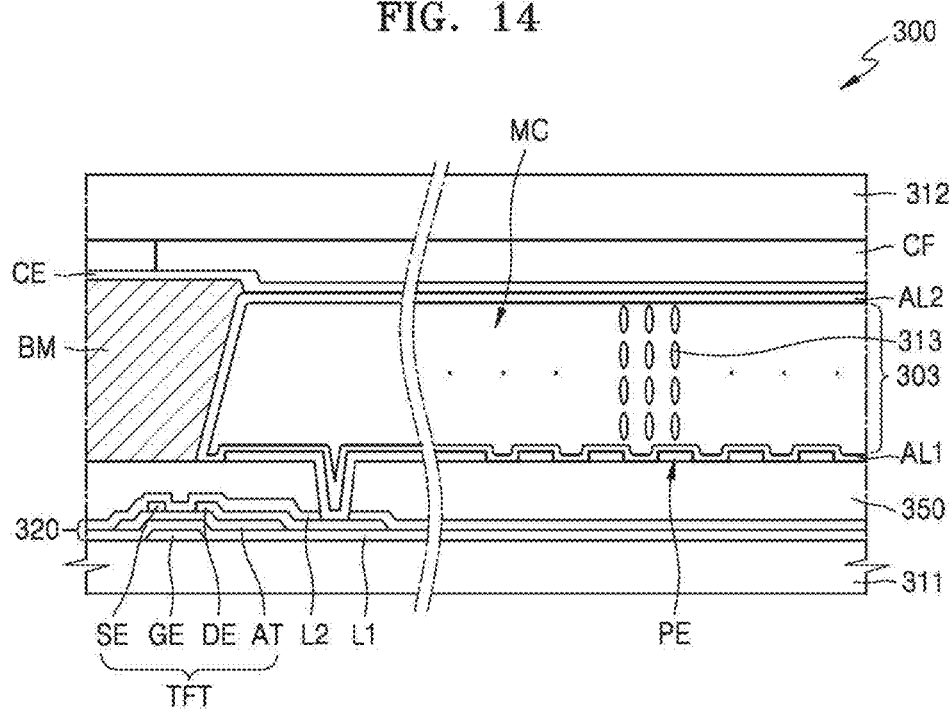
FIG. 14 is a schematic cross-sectional view of an LCD according to another exemplary embodiment of the present invention.

FIG. 14 is a schematic cross-sectional view of an LCD 300 according to another exemplary embodiment of the present invention.

Referring to FIG. 14, the LCD 300 may include a first substrate 311, an LC layer 303 disposed on the first substrate 311 and formed of a plurality of LC molecules 313, and a pixel electrode PE and a common electrode CE applying an electric field to the LC layer 303.

A TFT array layer 320, the pixel electrode PE, and a first alignment layer AL1 may be formed on the first substrate 311.

The TFT array layer 320 includes a plurality of switching devices TFT, and also includes a plurality of gate lines (not shown) and a plurality of data lines (not shown). Each switching device TFT may be a thin film transistor, and may include an active layer AT, a gate electrode GE, a source electrode SE, and a drain electrode DE.

A first insulating layer L1, which is a gate insulating layer, is formed on the gate electrode GE, and the active layer AT is formed on the first the insulating layer L1. The source electrode SE and the drain electrode DE are spaced apart from each other on the active layer AT, and a second insulating layer L2 is formed to cover the source electrode SE and the drain electrode DE.

A planarization layer 350 may be further formed on the TFT array layer 320, and the pixel electrode PE is located on the planarization layer 350. The pixel electrode PE penetrates through the planarization layer 350 and the second insulating layer L2 and contacts the drain electrode DE of the switching device TFT.

Micro-cavities MC may be formed on the planarization layer 350. The micro-cavities MC may be filled with the LC layer 303. The micro-cavities MC may be formed to face the area where the pixel electrode PE is formed, and may be formed for each pixel of the LCD 300. A black matrix BM may be formed between the micro-cavities MC.

The pixel electrode PE may be disposed below the micro-cavities MC, and the first alignment layer AL1 and a second alignment layer AL2 for arranging the LC molecules 313 may be respectively disposed above and below the micro-cavities MC, and may be connected to each other along the inner walls of the micro-cavities MC.

The common electrode CE may be formed on the micro-cavities MC, and a loop layer that forms the micro-cavities MC may be formed on the common electrode CE. The loop layer may include the color filter CF.

The common electrode CE may be formed of the transparent conductive film 10 of FIG. 1. In other words, the common electrode CE may include a second conductive layer formed of an Ag alloy and disposed between a first conductive layer formed of, for example, ITO and a third conductive layer.

The first conductive layer and the third conductive layer may prevent the second conductive layer from being exposed to the outside and damaged. The first conductive layer may improve the bonding capability between the common electrode CE and the planarization layer 350. The first conductive layer and the third conductive layer may each be formed to have a thickness in a range of 20 Å to 70 Å.

The second conductive layer may include Ag and an alloy element that prevents the Ag from cohering during formation of the second conductive layer, and may be formed to have a thickness in a range of 20 Å to 70 Å. The content of the alloy element in the second conductive layer may be 2 wt % to 35 wt %. The alloy element may include at least one of zinc (Zn), nickel (Ni), cobalt (Co), copper (Cu), gallium (Ga), germanium (Ge), platinum (Pt), antimony (Sb), manganese (Mn), tungsten (W), and molybdenum (Mo), and may further include indium (In) to improve durability against sulfur (S).

Thus, the common electrode CE may be formed to be very thin, and accordingly, may have good optical characteristics and good electrical properties.

The micro-cavities MC may be formed by first forming a sacrificial layer having the same shape as the micro-cavities MC on the first substrate 311, then forming the common electrode CE and a loop layer including the color filter CF on the sacrificial layer, and removing the sacrificial layer. At this time, the shape of the micro-cavities MC may be maintained by the loop layer, and the micro-cavities MC may be filled with the LC layer 303. After the loop layer is partially removed, the LC layer 303 may be injected into the micro-cavities MC. After the injection of the LC layer 303 is completed, an injection hole for the injection may be sealed.

The injection hole may be sealed by a capping layer 312. The capping layer 312 seals and protects both the loop layer and the LC layer 303. The capping layer 312 may be formed of a similar material to the loop layer, but the material used to form the capping layer 312 may be determined with consideration given to penetrability and permeability.

According to exemplary embodiments of the present invention, an ultra-thin transparent conductive film having good optical and electrical properties may be obtained, and LCDs including the ultra-thin transparent conductive film may have improved performance.

Although certain exemplary embodiments and implementations have been described herein, other exemplary embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
   a substrate; and
   an electrode positioned over the substrate,
   wherein:
   a voltage is applied to the electrode to display an image;
   the electrode comprises a first conductive layer, a second conductive layer disposed on the first conductive layer, and a third conductive layer disposed on the second conductive layer;
   the second conductive layer comprises Ag and an alloy element;
   the alloy element has a smaller atomic radius than Ag;
   a thickness of the second conductive layer is in a range of 20 Å to 60 Å;
   the second conductive layer has a transmittance of 85% or more in the range of 20 Å to 60 Å; the alloy element comprises at least one selected from the group consisting of zinc (Zn), nickel (Ni), cobalt (Co), gallium (Ga), germanium (Ge), antimony (Sb), manganese (Mn), tungsten (W), and molybdenum (Mo); and
   the content of the alloy element of the second conductive layer is in a range of 2 wt % to 35 wt %.

2. The display device of claim 1, wherein the thickness of the second conductive layer is in a range of 30 Å to 50 Å.

3. The display device of claim 1, wherein the second conductive layer further comprises indium (In).

4. The display device of claim 1, wherein the first conductive layer and the third conductive layer comprise at least one selected from the group consisting of ITO, IZO, and AZO.

5. The display device of claim 4, wherein a thickness of each of the first conductive layer and the third conductive layer is in a range of 20 Å to 70 Å.

6. The display device of claim 1, wherein light transmittance of the electrode is 80% or more.

7. The display device of claim 1, further comprising a thin film transistor positioned over the first substrate and a planarization layer covering the thin film transistor;

wherein the electrode is positioned over the planarization layer.

8. The display device of claim 7, wherein the thin film transistor comprises an active layer, a gate electrode, a source electrode, and a drain electrode.

* * * * *